(12) United States Patent
Chai et al.

(10) Patent No.: US 11,945,924 B2
(45) Date of Patent: Apr. 2, 2024

(54) FLUORINE-CONTAINING RESIN COMPOSITION, AND RESIN VANISH, FLUORINE-CONTAINING DIELECTRIC SHEET, LAMINATE, COPPER CLAD LAMINATE AND PRINTED CIRCUIT BOARD CONTAINING THE SAME

(71) Applicant: SHENGYI TECHNOLOGY CO., LTD., Guangdong (CN)

(72) Inventors: Songgang Chai, Guangdong (CN); Qianfa Liu, Guangdong (CN); Liangpeng Hao, Guangdong (CN); Wei Liang, Guangdong (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 0 days.

(21) Appl. No.: 17/766,440

(22) PCT Filed: Dec. 17, 2020

(86) PCT No.: PCT/CN2020/137249
§ 371 (c)(1),
(2) Date: Apr. 4, 2022

(87) PCT Pub. No.: WO2022/120921
PCT Pub. Date: Jun. 16, 2022

(65) Prior Publication Data
US 2023/0192972 A1    Jun. 22, 2023

(30) Foreign Application Priority Data

Dec. 9, 2020 (CN) .......................... 202011448026.4

(51) Int. Cl.
| | | |
|---|---|---|
| *C08J 5/18* | (2006.01) | |
| *C08K 7/18* | (2006.01) | |
| *C08K 9/06* | (2006.01) | |
| *C08L 27/18* | (2006.01) | |
| *H05K 1/03* | (2006.01) | |

(52) U.S. Cl.
CPC ............. *C08J 5/18* (2013.01); *C08K 7/18* (2013.01); *C08K 9/06* (2013.01); *C08L 27/18* (2013.01); *H05K 1/0373* (2013.01); *C08J 2327/18* (2013.01); *C08J 2427/18* (2013.01); *C08J 2471/02* (2013.01); *C08K 2201/005* (2013.01); *C08L 2201/52* (2013.01); *C08L 2203/16* (2013.01); *C08L 2203/20* (2013.01); *C08L 2205/025* (2013.01); *C08L 2205/03* (2013.01); *H05K 2201/0209* (2013.01)

(58) Field of Classification Search
CPC .............................................. H05K 2201/015
See application file for complete search history.

(56) References Cited

U.S. PATENT DOCUMENTS

| | | | | |
|---|---|---|---|---|
| 4,849,284 | A | * 7/1989 | Arthur | C08K 9/06 |
| | | | | 428/405 |
| 5,607,744 | A | * 3/1997 | Diener | C08K 9/06 |
| | | | | 428/209 |
| 2001/0053408 | A1 | 12/2001 | Allen | |
| 2005/0101714 | A1* | 5/2005 | Yamasaki | H05K 1/162 |
| | | | | 524/413 |
| 2013/0319609 | A1 | 12/2013 | Shim et al. | |
| 2014/0309343 | A1* | 10/2014 | Venema | C08F 8/42 |
| | | | | 525/523 |

FOREIGN PATENT DOCUMENTS

| | | |
|---|---|---|
| CN | 104558689 | 4/2015 |
| CN | 106854330 | 6/2017 |
| CN | 107674349 | 2/2018 |
| CN | 108659411 | 10/2018 |
| CN | 109476897 | 3/2019 |
| CN | 110423572 | 11/2019 |
| CN | 110591255 | 12/2019 |
| DE | 4200583 | 7/1992 |
| TW | 201245295 | 11/2012 |
| TW | 202031779 | 9/2020 |
| TW | 202039677 | 11/2020 |

OTHER PUBLICATIONS

Patent Cooperation Treaty (PCT), International Search Report and Written Opinion for Application PCT/CN2020/137249 filed on Dec. 17, 2020, dated Sep. 8, 2021, International Searching Authority, CN.
State Intellectual Property Office of People's Republic of China, Notification of Search Report for Application No. 2020114480264, China.

* cited by examiner

*Primary Examiner* — Ian A Rummel
(74) *Attorney, Agent, or Firm* — McDonald Hopkins LLC

(57) ABSTRACT

The present invention relates to a fluorine-containing resin composition, and a resin vanish, a fluorine-containing dielectric sheet, a laminate, a copper clad laminate and a printed circuit board containing the same. The fluorine-containing resin composition comprises 30 wt. %-70 wt. % of a fluorine-containing polymer, 30 wt. %-70 wt. % of an inorganic filler which includes the following particle size distribution: D10 is greater than 1.5 µm; and D50 is 10-15 µm. In the present invention, the selection of an inorganic filler with a specific particle size distribution can ensure that the boards prepared by the fluorine-containing resin composition have excellent dielectric properties and voltage resistance performance, even if the inorganic filler is added in a large amount.

14 Claims, No Drawings

FLUORINE-CONTAINING RESIN COMPOSITION, AND RESIN VANISH, FLUORINE-CONTAINING DIELECTRIC SHEET, LAMINATE, COPPER CLAD LAMINATE AND PRINTED CIRCUIT BOARD CONTAINING THE SAME

CROSS-REFERENCE TO RELATED APPLICATIONS

This application is a U.S. National Stage Application, filed under 35 U.S.C. 371 of International Patent Application No. PCT/CN2020/0137249 filed on Dec. 17, 2020, which claims priority to Chinese Patent Application No. 202011448026.4 filed with the China National Intellectual Property Administration (CNIPA) on Dec. 9, 2020, the disclosures of each of which are incorporated herein by reference in their entireties.

TECHNICAL FIELD

The present invention relates to the technical field of communication materials, in particular to a fluorine-containing resin composition, as well as a resin vanish, a fluorine-containing dielectric sheet, a laminate, a copper clad laminate and a printed circuit board containing the same.

BACKGROUND ART

Copper clad laminates are widely used in fields of mobile phones, computers, vending machines, communication base stations, satellites, wearable devices, unmanned vehicles, drones and smart robots. They are one of the key basic materials in the electronic communication and information industries. Fluorine-containing resins represented by polytetrafluoroethylene (PTFE) have a variety of excellent properties, such as low dielectric constant, low dielectric loss, high thermal stability and chemical stability, which other polymer resins cannot match. It is an ideal base material of copper clad laminates. Since the invention of PTFE-based copper clad laminate in the 1950s, researchers have gradually improved its manufacturing process through continuous optimization of formulations and parameters. The polymer chain of fluorine-containing resins is flexible, and it is often necessary to introduce reinforcing materials such as glass fabrics to improve the mechanical strength of fluorine-containing resin-based copper clad laminates. In addition, the dielectric constant of the fluorine-containing resin itself is very low ($Dk \leq 2.2$), while the dielectric constant of glass fabrics is generally only about 6.5. In the manufacturing process of the substrate, the heavy use of glass fabrics restricts the addition of a large number of other inorganic fillers to the fluorine-containing resin matrix, which makes it extremely difficult to produce the fluorine-containing resin-based copper clad laminates with low dielectric constant. Certainly, fluorine-containing resin-based copper clad laminates without glass fiber reinforcement have been developed. CN104175686A discloses a method for preparing a PTFE composite dielectric substrate, comprising: mixing a fluororesin emulsion, an inorganic filler and a thickener to prepare a dispersion, then coating the dispersion on a releasable substrate followed by baking, separating the resin layer from the substrate, cutting, laminating and sintering to prepare the composite dielectric substrate. U.S. Pat. No. 4,335,180A discloses a microwave circuit board and a method for manufacturing a microwave circuit board. It discloses mixing microfiber, an inorganic filler and a flocculant into a PTFE emulsion successively, and then filtering-drying to obtain a fluorine-containing resin mixture, compressing the mixture into a board, laminating the board with a copper foil and then compressing together to obtain a fluorine-containing resin-based copper clad laminate without glass fabrics reinforcement. However, the problem in the aforementioned patent applications is that the interaction force between the unmodified inorganic filler and the fluorine-containing resin matrix is very poor. Especially when the addition amount of the inorganic filler is required to be large, the dispersibility of the inorganic filler in the matrix is extremely poor; the unevenness of the dielectric properties of the board is extremely serious; and the mechanical properties are difficult to meet the actual use requirements.

Therefore, there is an urgent need to solve the problems of poor interaction force between unmodified inorganic fillers and the PTFE resin matrix, and the decreases in electrical performance and voltage resistance caused by the large addition of inorganic fillers in the PTFE resin system.

CONTENTS OF THE INVENTION

One of the objectives of the present invention is to provide a fluorine-containing resin composition which can ensure that the boards prepared from the fluorine-containing resin composition have excellent dielectric properties and voltage resistance performance, even if the inorganic filler is unmodified or added in a large amount.

In order to achieve such objective, the present invention discloses the following technical solutions.

The present invention provides a fluorine-containing resin composition, comprising 30 wt. %-70 wt. % of a fluorine-containing polymer, and 30 wt. %-70 wt. % of an inorganic filler which includes the following particle size distribution: D10 is greater than 1.5 µm; and D50 is 10-15 µm.

In the fluorine-containing polymer resin system of the present invention, the addition of the inorganic filler with a specific particle size distribution, even if the inorganic filler is added in a large amount (30 wt. %-70 wt. %), can ensure that the boards prepared from the fluorine-containing resin composition have excellent dielectric properties and voltage resistance performance, so as to meet the performance requirements in the field of high-frequency and high-speed communication, such as diversified and complicated functions of copper clad laminate materials, high-density and multi-layer wiring layout, etc.

The fluorine-containing resin composition comprises the following components: 30 wt. %-70 wt. % of a fluorine-containing polymer, e.g. 32 wt. %, 34 wt. %, 36 wt. %, 38 wt. %, 40 wt. %, 42 wt. %, 44 wt. %, 46 wt. %, 48 wt. %, 50 wt. %, 52 wt. %, 54 wt. %, 56 wt. %, 58 wt. %, 60 wt. %, 62 wt. %, 64 wt. %, 66 wt. %, 68 wt. % and etc.; 30 wt. %-70 wt. % of an inorganic filler, e.g. 32 wt. %, 34 wt. %, 36 wt. %, 38 wt. %, 40 wt. %, 42 wt. %, 44 wt. %, 46 wt. %, 48 wt. %, 50 wt. %, 52 wt. %, 54 wt. %, 56 wt. %, 58 wt. %, 60 wt. %, 62 wt. %, 64 wt. %, 66 wt. %, 68 wt. % and etc.

The inorganic filler has the following particle size distribution: D10 is greater than 1.5 µm, e.g. 1.6 µm, 1.7 µm, 1.8 µm, 1.9 µm, 2 µm, 2.1 µm, 2.2 µm, 2.3 µm, 2.4 µm, 2.5 µm and etc.; D50 is 10-15 µm, e.g. 11.2 µm, 11.4 µm, 11.6 µm, 11.8 µm, 12 µm, 12.2 µm, 12.4 µm, 12.6 µm, 12.8 µm, 13 µm, 13.2 µm, 13.4 µm, 13.6 µm, 13.8 µm, 14 µm, 14.2 µm, 14.4 µm, 14.6 µm, 14.8 µm and etc.

The specific particle size distribution of the present invention is selected based on the fluorine-containing polymer matrix. If D10 is less than 1.5 μm, the interface between the inorganic filler and the fluorine-containing polymer is too many, resulting in worse dielectric loss; if D50 is less than 10 μm, there are many interfaces between the inorganic filler and the fluorine-containing polymer, resulting in worse dielectric loss; if D50 is greater than 15 μm, the inorganic filler is easily bridged in the fluorine-containing polymer to form pathways, resulting in poor voltage resistance performance.

Preferably, the inorganic filler further comprises the following particle size distributions: D90 is less than 30 μm, e.g. 15 μm, 16 μm, 17 μm, 18 μm, 19 μm, 20 μm, 21 μm, 22 μm, 23 μm, 24 μm, 25 μm, 26 μm, 27 μm, 28 μm, 29 μm and etc.; D100 is less than 50 μm, e.g. 22 μm, 24 μm, 26 μm, 28 μm, 30 μm, 32 μm, 34 μm, 36 μm, 38 μm, 40 μm, 42 μm, 44 μm, 46 μm, 48 μm and etc.

In the preferred technical solution of the present invention, specific D90 and D100 values continue to be preferred on the basis of the specific D10 and D50. Within the above ranges, the dielectric properties and voltage resistance performance of the boards prepared from the fluorine-containing resin composition can be further improved. If D90 is greater than 30 μm, it will lead to worse voltage resistance performance. If D100 is greater than 50 μm, it will cause large particles to be exposed on the surface of the fluorine-containing polymer, reducing the voltage resistance performance of the boards and the bonding strength between the copper foil and the fluorine-containing polymer.

Preferably, the inorganic filler has a specific surface area less than or equal to 3.0 $m^2/g$, e.g. 1.1 $m^2/g$, 1.2 $m^2/g$, 1.3 $m^2/g$, 1.4 $m^2/g$, 1.5 $m^2/g$, 1.6 $m^2/g$, 1.7 $m^2/g$, 1.8 $m^2/g$, 1.9 $m^2/g$, 2 $m^2/g$, 2.1 $m^2/g$, 2.2 $m^2/g$, 2.3 $m^2/g$, 2.4 $m^2/g$, 2.5 $m^2/g$, 2.6 $m^2/g$, 2.7 $m^2/g$, 2.8 $m^2/g$, 2.9 $m^2/g$ and etc., preferably less than or equal to 2.0 $m^2/g$.

In the present invention, it is further preferred that the specific surface area of the inorganic filler is less than or equal to 3.0 $m^2/g$, so as to further improve the dielectric properties and voltage resistance performance of the boards. If the specific surface area is higher than 3.0 $m^2/g$, the problem of excessive interfaces between the inorganic filler and the fluorine-containing polymer is likely to occur, resulting in a decrease in dielectric properties and voltage resistance performance.

Preferably, the inorganic filler is a spherical inorganic filler.

A spherical inorganic filler is further preferred in the present invention. Compared with fillers in other shapes, the spherical inorganic filler has fewer interfaces with the fluorine-containing polymer and lower stress, which can further improve dielectric properties and voltage resistance performance.

Preferably, the inorganic filler is any one selected from the group consisting of $SiO_2$, $Al_2O_3$, $TiO_2$, $BaTiO_3$, $SrTiO_3$, AlN, BN, $Si_3N_4$, SiC, $CaTiO_3$, $ZnTiO_3$, $BaSnO_3$, hollow glass beads, chopped glass fiber powder, chopped quartz fiber powder, and a combination of at least two selected therefrom.

Preferably, the inorganic filler comprises an inorganic filler treated with a silane coupling agent.

Preferably, the silane coupling agent comprises a combination of a polar coupling agent and a non-polar coupling agent.

In the present invention, it is preferable to use the amphoteric silane coupling agent combination to modify the filler, which can further improve the dielectric properties and voltage resistance performance. If only the polar silane coupling agent is used for modification, the compatibility between the inorganic filler and the fluorine-containing polymer will deteriorate during the process, which will lead to the deterioration of dielectric properties and voltage resistance performance. If only the non-polar silane coupling agent is used for modification, the inorganic filler is not easy to infiltrate in the emulsion, and the product is prone to voids and poor pressure resistance.

Preferably, the polar coupling agent and the non-polar coupling agent has a mass ratio of 1:5-1:1, e.g. 1:4, 1:3, 1:2 and etc.

In the present invention, it is further preferred that the polar and non-polar coupling agents are combined to modify the inorganic filler according to the above specific ratio, so as to further improve the dielectric properties and voltage resistance performance of the boards.

Preferably, the non-polar coupling agent includes a fluorine-containing silane coupling agent, preferably a perfluorosilane coupling agent.

Preferably, the polar coupling agent comprises any one selected from the group consisting of an amino silane coupling agent, an epoxy silane coupling agent, a borate coupling agent, a zirconate coupling agent, a phosphate coupling agent, and a combination of at least two selected therefrom.

Preferably, the silane coupling agent comprises a combination of a fluorine-containing silane coupling agent and an epoxy silane coupling agent.

Preferably, the amount of the silane coupling agent in the inorganic filler treated with a silane coupling agent accounts for 0.05 wt. % to 5 wt. % of the inorganic filler, e.g. 0.1 wt. %, 0.5 wt. %, 1 wt. %, 1.5 wt. %, 2 wt. %, 2.5 wt. %, 3 wt. %, 3.5 wt. %, 4 wt. %, 4.5 wt. %, 4.8 wt. % and etc.

Preferably, the magnetic substance content of the inorganic filler is less than 50 ppm.

Preferably, the fluorine-containing polymer is any one selected from the group consisting of polytetrafluoroethylene, polyperfluoroethylene propylene, tetrafluoroethylene-perfluoroalkoxy vinyl ether copolymer, ethylene-tetrafluoroethylene copolymer, polychlorotrifluoroethylene, ethylene-chlorotrifluoroethylene copolymer and derivatives thereof, polyvinylidene fluoride and derivatives thereof, and a combination of at least two selected therefrom, preferably a combination of polytetrafluoroethylene and tetrafluoroethylene-perfluoroalkoxy vinyl ether copolymer.

Preferably, the fluorine-containing resin composition further comprises a surfactant, preferably a non-ionic surfactant.

Preferably, the surfactant is added in an amount of 1 wt. %-10 wt. %, e.g. 2 wt. %, 3 wt. %, 4 wt. %, 5 wt. %, 6 wt. %, 7 wt. %, 8 wt. %, 9 wt. % and etc.

The second objective of the present invention is to provide a resin vanish, which comprises the fluorine-containing resin composition described in the first objective and a solvent.

The solvent in the present invention is not particularly limited. The solvent can be introduced after the components of the fluorine-containing resin composition are mixed; or the solvent can be introduced through the resin raw material, for example, directly mixing the fluorine-containing polymer emulsion with other components to form the resin vanish.

The third objective of the present invention is to provide a fluorine-containing dielectric sheet containing the fluorine-containing resin composition described in the first objective.

Preferably, the fluorine-containing dielectric sheet contains no continuously-reinforcing materials.

Preferably, the method for the preparation of the fluorine-containing dielectric sheet includes scrape coating the resin vanish described in the second objective on a clean high-temperature resistant film to form a film, drying and sintering the film, and conducting peeling to obtain a fluorine-containing dielectric sheet.

Preferably, the drying temperature is 100-260° C., such as 120° C., 140° C., 160° C., 180° C., 200° C., 220° C., 240° C., 250° C. and etc.

Preferably, the drying lasts for 10 min-2 h, such as 20 min, 40 min, 1 h, 1 h 20 min, 1 h 40 min and etc.

Preferably, the sintering temperature is 200-400° C., such as 220° C., 240° C., 260° C., 280° C., 300° C., 320° C., 340° C., 360° C., 380° C. and etc.

Preferably, the sintering lasts for 2-12 h, such as 3 h, 4 h, 5 h, 6 h, 7 h, 8 h, 9 h, 10 h, 11 h and etc.

Preferably, the sintering is performed in an inert gas atmosphere.

Preferably, the inert gas includes nitrogen and/or argon.

Preferably, the high-temperature resistant film includes a polyimide (PI) film.

The fourth objective of the present invention is to provide a laminate comprising at least one fluorine-containing dielectric sheet according to the third objective.

Preferably, the method for the preparation of the laminate is to bond one or two or more fluorine-containing dielectric sheets described in the third objective by a lamination process.

Preferably, the temperature of the lamination is 200-400° C., such as 220° C., 240° C., 260° C., 280° C., 300° C., 320° C., 340° C., 360° C., 380° C. and etc.

Preferably, the pressure of the lamination is 70-250 kg/cm$^2$, such as 80 kg/cm$^2$, 100 kg/cm$^2$, 120 kg/cm$^2$, 140 kg/cm$^2$, 160 kg/cm$^2$, 180 kg/cm$^2$, 200 kg/cm$^2$, 220 kg/cm$^2$, 240 kg/cm$^2$ and etc.

Preferably, the lamination lasts for 2-12 h, such as 3 h, 4 h, 6 h, 7 h, 8 h, 9 h, 10 h, 11 h, 12 h and etc.

Preferably, the thickness of the laminate is 0.01-10 mm, such as 0.1 mm, 0.5 mm, 1 mm, 2 mm, 3 mm, 4 mm, 5 mm, 6 mm, 7 mm, 8 mm, 9 mm and etc.

The fifth objective of the present invention is to provide a copper clad laminate comprising at least one fluorine-containing dielectric sheet according to the third objective and metal foil(s) covered on one or both sides of the laminated fluorine-containing dielectric sheet.

Preferably, the metal foil is a copper foil, a nickel foil, an aluminum foil or an SUS foil or the like.

The sixth objective of the present invention is to provide a printed circuit board comprising the laminate according to the fourth objective or the copper clad laminate according to the fifth objective.

Preferably, the printed circuit board is a high-frequency printed circuit board. In the present invention, "high frequency" is defined as a frequency of 1 GHz or more.

Compared with the prior art, the present invention has the following beneficial effects.

In the present invention, an inorganic filler with a specific particle size distribution is added to the fluorine-containing polymer resin system. Even if the inorganic filler is added in a large amount, it can ensure that the boards prepared from the fluorine-containing resin composition have excellent dielectric properties and voltage resistance performance, so as to meet various performance requirements in the high-frequency and high-speed communication fields, such as the diversified and complicated functions of the copper clad material, and the high-density and multi-layer wiring layout, etc.

The Dk (10 GHz) of the copper clad laminate provided by the present invention is 3.15 or less; the Df (10 GHz) is 0.0010 or less; and the breakdown voltage is 50 kV or more.

EMBODIMENTS

The technical solution of the present invention will be further explained through specific embodiments below. It should be understood by those skilled in the art that the examples are merely to help understand the present invention and should not be regarded as specific limitations to the present invention.

The specific particle size distributions of the inorganic fillers used in the following examples and comparative examples are shown in Table 1.

TABLE 1

| Indicators | | Inorganic filler (spherical silica/spherical titanium dioxide being 5:1) | | | | | | | | | | Inorganic filler (angular silica/angular titanium dioxide being 5:1) |
| --- | --- | --- | --- | --- | --- | --- | --- | --- | --- | --- | --- | --- |
| | | A | B | C | D | E | F | G | H | I | J | K |
| Particle size distribution | D10 | 1.7 | 2.0 | 2.3 | 0.9 | 3.4 | 1.2 | 1.8 | 1.9 | 1.7 | 2.1 | 1.8 |
| | D50 | 10.8 | 12.5 | 14.3 | 8.8 | 18.2 | 12.6 | 9.2 | 16.9 | 12.6 | 13.1 | 12.6 |
| | D90 | 23.9 | 25.2 | 27.5 | 18.9 | 35.7 | 25.3 | 23.7 | 24.0 | 32.7 | 28.6 | 24.1 |
| | D100 | 38.9 | 43.5 | 48.6 | 25.5 | 66.2 | 39.6 | 40.1 | 39.5 | 37.9 | 52.9 | 37.8 |
| Specific surface area/m$^2$/g | | 2.0 | 1.8 | 1.6 | 3.3 | 1.1 | 2.3 | 2.4 | 1.9 | 1.7 | 1.0 | 1.8 |
| Magnetic substance content/ppm | | 7 | 1 | 8 | 150 | 100 | 7 | 7 | 7 | 7 | 7 | 7 |

TABLE 1-continued

| Indicators | | Inorganic filler (spherical silica) L | Inorganic filler (spherical silica/ spherical titanium dioxide being 6:1) M | Inorganic filler (spherical silica/ spherical titanium dioxide/boron nitride being 4:1:1) N |
|---|---|---|---|---|
| Particle size distribution | D10 | 1.6 | 1.8 | 2.2 |
| | D50 | 10.5 | 11.5 | 13.3 |
| | D90 | 28.7 | 27.8 | 28.5 |
| | D100 | 41.9 | 41.5 | 47.7 |
| Specific surface area/m$^2$/g | | 1.8 | 1.7 | 1.6 |
| Magnetic substance content/ppm | | 12 | 18 | 15 |

EXAMPLE 1

This example provides a fluorine-containing resin composition comprising the following components: a PTFE resin (247.5 g), an inorganic filler A (300 g), and a thickener (4 g).

The method for the preparation of the above-mentioned fluorine-containing resin composition comprised taking 450 g of a PTFE resin emulsion (with a particle size of 0.25 μm, a resin content of 55 wt. %, produced by Japan Daikin Industries, brand name: D210C), adding 300 g of an inorganic filler A and 4 g of a thickener (Polyoxyethylene distyrenated phenyl ether, Kao Co., Ltd., brand name: EMULGEN A-60), stirring and mixing for 2 h to obtain a resin vanish of the fluorine-containing resin composition.

This example also provides a copper clad laminate, and the preparation method is as follows.

The above resin vanish was coated on a surface of a PI film with a coater, and a resin layer with a thickness of 129 μm was coated to obtain a glued PI film. The glued PI film was placed in a vacuum oven at 100° C., baked for 1 h to remove water, baked at 260° C. for 1 h to remove additives, and baked at 350° C. for 10 min. After cooling, the resin layer was peeled off from the PI film to obtain a resin layer with uniform thickness and good appearance. In order to produce a board having a thickness of 0.127 mm, two PTFE resin layers having a thickness of 129 μm were laminated with a size of 250×250 mm. The top and bottom of the laminated resin layers were covered with a copper foil having a thickness of 1 OZ for lamination. The pressure was about 400 PSI, and the maximum temperature and retention time were 380° C./60 min, to obtain a PTFE copper clad laminate.

EXAMPLE 2

The only difference from Example 1 is that the inorganic filler A was replaced with an inorganic filler B of equal mass.

EXAMPLE 3

The only difference from Example 1 is that the inorganic filler A was replaced with an inorganic filler A which was surface-modified with a silane coupling agent, wherein the silane coupling agent was a combination of a polar coupling agent (Perfluorosilane, Sico Performance Material (Shandong) Co., Ltd., F823) and a non-polar coupling agent (a silane coupling agent with epoxy groups, Shin-Etsu Chemical, product name KBM403) with a mass ratio of 1:3; and the amount of the silane coupling agent was 0.5% of the mass of the inorganic filler A.

EXAMPLE 4

The only difference from Example 3 is that the silane coupling agent was a non-polar coupling agent (Perfluorosilane, Sico Performance Material (Shandong) Co., Ltd., F823) with an amount of 0.5% of the mass of the inorganic filler A.

EXAMPLE 5

The only difference from Example 3 is that the silane coupling agent was a polar coupling agent (a silane coupling agent with epoxy groups, Shin-Etsu Chemical, product name KBM403) with an amount of 0.5% of the mass of the inorganic filler A.

EXAMPLE 6-9

The only difference from Example 3 is that the mass ratios of the polar coupling agent to the non-polar coupling agent were 1:1 (Example 6), 1:2 (Example 7), 1:4 (Example 8) and 1:5 (Example 9).

EXAMPLE 10

The only difference from Example 1 is that the inorganic filler A was replaced with an inorganic filler C of equal mass.

EXAMPLE 11

The only difference from Example 1 is that the inorganic filler A was replaced with an inorganic filler I of equal mass.

EXAMPLE 12

The only difference from Example 1 is that the inorganic filler A was replaced with an inorganic filler J of equal mass.

EXAMPLE 13

The only difference from Example 1 is that the inorganic filler A was replaced with an inorganic filler K of equal mass.

EXAMPLE 14

This example provides a fluorine-containing resin composition comprising the following components: a PTFE resin (300 g) and an inorganic filler A (696 g).

The preparation method of the above fluorine-containing resin composition was the same as that of Example 1, except that 545 g of a PTFE resin emulsion was taken.

This example also provides a copper clad laminate, and the preparation method was the same as that of Example 1.

EXAMPLE 15

This example provides a fluorine-containing resin composition, which is different from Example 1 only in that the fluorine-containing resin composition further contained a tetrafluoroethylene-perfluoroalkoxy vinyl ether copolymer (448.5 g).

The preparation method of the above-mentioned fluorine-containing resin composition was the same as that of Example 1, except that it further included taking 200 g of the tetrafluoroethylene-perfluoroalkoxy vinyl ether copolymer emulsion (purchased from Sichuan Chenguang, brand name: PFA-E50, having a solid content of 50%) to mix with 634 g of a PTFE resin emulsion (with a particle size of 0.25 μm, a resin content of 55 wt. %, produced by Japan Daikin Industries, brand name: D210C).

This example also provides a copper clad laminate, and the preparation method was the same as that in Example 1.

EXAMPLE 16

The only difference from Example 15 is that the inorganic filler A was replaced with an inorganic filler L of equal mass.

EXAMPLE 17

The only difference from Example 15 is that the inorganic filler A was replaced with an inorganic filler M of equal mass.

EXAMPLE 18

The only difference from Example 15 is that the inorganic filler A was replaced with an inorganic filler N of equal mass.

COMPARATIVE EXAMPLE 1

The only difference from Example 1 is that the inorganic filler A was replaced with an inorganic filler D of equal mass.

COMPARATIVE EXAMPLE 2

The only difference from Example 1 is that the inorganic filler A was replaced with an inorganic filler E of equal mass.

COMPARATIVE EXAMPLE 3

The only difference from Example 1 is that the inorganic filler A was replaced with an inorganic filler F of equal mass.

COMPARATIVE EXAMPLE 4

The only difference from Example 1 is that the inorganic filler A was replaced with an inorganic filler G of equal mass.

COMPARATIVE EXAMPLE 5

The only difference from Example 1 is that the inorganic filler A was replaced with an inorganic filler H of equal mass.

Performance Tests

For the above indicators, the copper clad laminates prepared in the examples and comparative examples were subjected to the following performance tests.
(1) Dk and Df test: tested by the SPDR (splite post dielectric resonator) method with a test condition of A state and a frequency of 10 GHz.
(2) Breakdown voltage test: IPC-TM-650 2.5.6 method.
(3) Particle size test: tested with Malvern 2000 laser particle size analyzer.
(4) Specific surface area test: tested with American Micromeritics model GEMINI VII2390(A) analyzer.
(5) Magnetic substance test: dispersing 300 g of an inorganic filler in water, adsorbing in a beaker with a 4000 Gauss magnet, weighing the adsorbed substance.

The results of the above tests are shown in Table 2.

TABLE 2

| | Dk (10 GHz) | Df (10 GHz) | Breakdown voltage (KV) |
|---|---|---|---|
| Example 1 | 2.97 | 0.0009 | 55 |
| Example 2 | 3.02 | 0.0008 | 56 |
| Example 3 | 3.01 | 0.0006 | 60 |
| Example 4 | 2.99 | 0.0006 | 55 |
| Example 5 | 2.98 | 0.0009 | 50 |
| Example 6 | 2.97 | 0.0008 | 60 |
| Example 7 | 2.97 | 0.0007 | 65 |
| Example 8 | 2.98 | 0.0006 | 60 |
| Example 9 | 2.99 | 0.0007 | 60 |
| Example 10 | 3.01 | 0.0008 | 52 |
| Example 11 | 2.99 | 0.0009 | 52 |
| Example 12 | 2.99 | 0.0010 | 51 |
| Example 13 | 2.95 | 0.0010 | 50 |
| Example 14 | 3.15 | 0.0010 | 50 |
| Example 15 | 2.85 | 0.0007 | 50 |
| Example 16 | 2.75 | 0.0007 | 55 |
| Example 17 | 2.80 | 0.0008 | 56 |
| Example 18 | 2.78 | 0.0009 | 56 |
| Comp. Exmp. 1 | 3.20 | 0.0015 | 35 |
| Comp. Exmp. 2 | 3.23 | 0.0013 | 25 |
| Comp. Exmp. 3 | 2.99 | 0.0009 | 45 |
| Comp. Exmp. 4 | 2.96 | 0.0011 | 40 |
| Comp. Exmp. 5 | 2.98 | 0.0013 | 30 |

It can be seen from Table 2 that the fluorine-containing resin composition provided by the present invention, even if the inorganic filler is unmodified or added in a large amount, can ensure that the prepared board has excellent dielectric properties and voltage resistance performance, so as to meet various performance requirements in the high-frequency and high-speed communication fields, such as diversified and complicated functions of copper clad laminate materials, the high-density and multi-layer wiring layout, etc.

Since the inorganic filler used in Comparative Example 1 has a small particle size, especially a large number of small particles, the interface between the inorganic material and the PTFE resin in the copper clad laminate is large, resulting in a great dielectric loss. In Comparative Example 2, the breakdown voltage performance of the board deteriorates due to the large particle size of the inorganic filler. In addition, the relatively high content of magnetic substance existing in fillers in Comparative Examples 1 and 2 will also cause large dielectric loss.

In addition, only D10 of the inorganic filler in Comparative Example 3 is not within the scope of the present invention, and only D50 of the inorganic fillers in Comparative Examples 4-5 is not within the scope of the present invention. The resulting copper clad laminates are inferior in dielectric properties and voltage resistance performance as compared with those in the examples. It thus proves that the present invention effectively improves the dielectric properties and voltage resistance performance of the copper clad laminate by selecting a specific particle size distribution.

By comparing Examples 3-5, it can be seen that using a combination of a polar coupling agent and a non-polar coupling agent to modify an inorganic filler (Example 3) can further improve the dielectric properties and voltage resistance performance of the copper clad laminate, as compared with the modification processed by a single type of coupling agent (Examples 4 and 5).

By comparing Examples 1, 11 and 12, it can be seen that when the D90 of the inorganic filler is less than 30 μm, and the D100 is less than 50 μm (Example 1), the dielectric properties and voltage resistance performance of the copper clad laminate can be further improved. If D90 is greater than 30 μm (Example 11), or D100 is greater than 50 μm (Example 12), it will result in poor dielectric properties and voltage resistance performance.

By comparing Example 1 and Example 13, it can be seen that in the fluorine-containing polymer system, the spherical inorganic filler (Example 1) is more conducive to improving the dielectric properties and voltage resistance performance of copper clad laminates than other shapes (Example 13).

The present invention illustrates the detailed methods of the present invention with the above-mentioned examples. However, the present invention is not limited to the above-mentioned detailed methods, which means that the present invention does not have to rely on the above-mentioned detailed methods to be implemented. Those skilled in the art should understand that any improvement to the present invention, equivalent replacement of each raw material of the product of the present invention, addition of auxiliary components, selection of specific methods and etc. all fall within the scope of protection and disclosure of the present invention.

The invention claimed is:

1. A copper clad laminate comprising at least one fluorine-containing dielectric sheet and metal foil(s) covered on one or both sides of the laminated fluorine-containing dielectric sheet, wherein the copper clad laminate has a Dk (10 GHz) of 3.15 or less; a Df (10 GHz) is 0.0010 or less; and a breakdown voltage is 50 kV or more;
wherein the fluorine-containing dielectric sheet comprising a fluorine-containing resin composition;
the fluorine-containing resin composition, comprising 30 wt. %-70 wt. % of a fluorine-containing polymer, and 30 wt. %-70 wt. % of an inorganic filler, wherein the inorganic filler includes the following particle size distribution: D10 is greater than 1.5 μm; and D50 is 10-15 μm;
wherein the inorganic filler further includes the following particle size distribution: D90 is less than 30 μm; and D100 is less than 50 μm; and
wherein the inorganic filler has a specific surface area less than or equal to 3.0 m²/g.

2. The copper clad laminate claimed in claim 1, wherein the inorganic filler comprises an inorganic filler treated with a silane coupling agent.

3. The copper clad laminate claimed in claim 1, wherein the fluorine-containing polymer is any one selected from the group consisting of polytetrafluoroethylene, polyperfluoroethylene propylene, tetrafluoro-ethylene-perfluoroalkoxy vinyl ether copolymer, ethylene-tetrafluoroethylene copolymer, polychlorotrifluoroethylene, ethylene-chlorotrifluoroethylene copolymer and derivatives thereof, polyvinylidene fluoride and derivatives thereof, and a combination of at least two selected therefrom.

4. The copper clad laminate claimed in claim 1, wherein the fluorine-containing resin composition further comprises a surfactant;
the surfactant is added in an amount of 1 wt. %-10 wt. %.

5. A printed circuit board comprising the copper clad laminate claimed in claim 1.

6. The copper clad laminate claimed in claim 1, wherein the inorganic filler is a spherical inorganic filler.

7. The copper clad laminate claimed in claim 1, wherein the inorganic filler comprises any one of $SiO_2$, $Al_2O_3$, $TiO_2$, $BaTiO_3$, $SrTiO_3$, AlN, BN, $Si_3N_4$, SiC, $CaTiO_3$, $ZnTiO_3$, $BaSnO_3$, hollow glass beads, chopped glass fiber powder, chopped quartz fiber powder, and a combination of at least two selected therefrom.

8. The copper clad laminate claimed in claim 2, wherein the silane coupling agent comprises a combination of a polar coupling agent and a non-polar coupling agent.

9. The copper clad laminate claimed in claim 8, wherein the polar coupling agent and the non-polar coupling agent has a mass ratio of 1:5-1:1.

10. The copper clad laminate claimed in claim 8, wherein the non-polar coupling agent comprises a fluorine-containing silane coupling agent.

11. The copper clad laminate claimed in claim 8, wherein the polar coupling agent comprises any one selected from the group consisting of an amino silane coupling agent, an epoxy silane coupling agent, a borate coupling agent, a zirconate coupling agent, a phosphate coupling agent, and a combination of at least two selected therefrom.

12. The copper clad laminate claimed in claim 8, wherein the silane coupling agent comprises a combination of a fluorine-containing silane coupling agent and an epoxy silane coupling agent.

13. The copper clad laminate claimed in claim 2, wherein the amount of the silane coupling agent in the inorganic filler treated with a silane coupling agent accounts for 0.05 wt. % to 5 wt. % of the inorganic filler.

14. The copper clad laminate claimed in claim 1, wherein a magnetic substance content of the inorganic filler is less than 50 ppm.

* * * * *